(12) United States Patent
Winch et al.

(10) Patent No.: US 8,723,053 B2
(45) Date of Patent: May 13, 2014

(54) ELECTROMAGNETICALLY SHIELDED ENCLOSURE WITH OPERABLE INTERFACES

(75) Inventors: Gary William Winch, Naples, NY (US); Brian Donald Smith, Keuka Park, NY (US)

(73) Assignee: Select Fabricators, Inc., Canandaigua, NY (US)

( * ) Notice: Subject to any disclaimer, the term of this patent is extended or adjusted under 35 U.S.C. 154(b) by 105 days.

(21) Appl. No.: 13/411,528

(22) Filed: Mar. 3, 2012

(65) Prior Publication Data

US 2012/0228020 A1    Sep. 13, 2012

Related U.S. Application Data

(60) Provisional application No. 61/451,069, filed on Mar. 9, 2011.

(51) Int. Cl.
*H05K 9/00*    (2006.01)

(52) U.S. Cl.
USPC ............ 174/359; 174/378; 174/382; 206/720

(58) Field of Classification Search
USPC ................. 174/378, 382, 384, 359; 361/818; 455/575.8; 206/720
See application file for complete search history.

(56) References Cited

U.S. PATENT DOCUMENTS

| | | | |
|---|---|---|---|
| 4,884,171 A | 11/1989 | Maserang et al. | |
| 5,043,529 A | 8/1991 | Vanesky et al. | |
| 5,136,119 A | 8/1992 | Leyland | |
| 5,162,610 A | 11/1992 | Clifton et al. | |
| 5,171,936 A | 12/1992 | Suzuki et al. | |
| 5,565,656 A | 10/1996 | Mottahed | |
| 5,594,200 A * | 1/1997 | Ramsey | 174/382 |
| 5,739,463 A * | 4/1998 | Diaz et al. | 174/378 |
| 6,121,544 A | 9/2000 | Petsinger | |
| 6,140,576 A * | 10/2000 | Kanne et al. | 174/378 |
| 7,075,798 B2 * | 7/2006 | Hendrickson | 361/818 |
| 7,576,289 B2 | 8/2009 | Kessel | |
| 7,601,921 B2 | 10/2009 | Schroader | |
| 7,830,672 B1 | 11/2010 | Kitchen | |
| 2003/0070826 A1 * | 4/2003 | Cerniglia et al. | 174/35 R |
| 2008/0268924 A1 | 10/2008 | Chang | |
| 2010/0270070 A1 | 10/2010 | Bradley | |
| 2012/0285737 A1 * | 11/2012 | Judy et al. | 174/381 |
| 2013/0277101 A1 * | 10/2013 | Judy | 174/378 |

OTHER PUBLICATIONS

Web Pages from eDEC dated May 29, 2012. http://faraday-bags.com/index.php/blackholefaradaybags/black-hole-data-bag-kit.html/. Author Unknown.

(Continued)

*Primary Examiner* — Hung Ngo
(74) *Attorney, Agent, or Firm* — Robert D. Gunderman, Jr.; Patent Technologies, LLC

(57) ABSTRACT

An electromagnetically shielded enclosure with operable interfaces that is portable and lightweight. The electromagnetically shielded enclosure has operable interfaces including a tactile interface through the shielding material and optionally a shielded tactile window for viewing of a secured electronic device and also for operating the secured electronic device should it have a touch screen. An internal frame is optionally provided that prevents conductive interference of a secured electronic device touch screen by the shielded tactile window. An input/output assembly is further provided to allow signals and power to be brought in or out of the enclosure to connect with the secured electronic device without compromising radio silence.

14 Claims, 15 Drawing Sheets

(56) References Cited

OTHER PUBLICATIONS

Web pages from Cellular.Sherlock dated Mar. 27, 2012. http://blog.csvance.com/? p=202. Christopher Vance.

Black Hole Faraday Bags. Data Sheet. Date unknown. one page. Publisher information unknown. Author Unknown.

\* cited by examiner

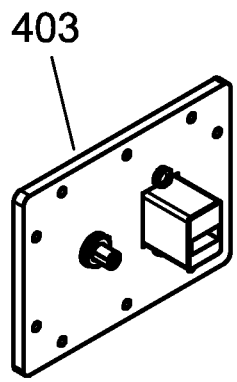
Fig. 15
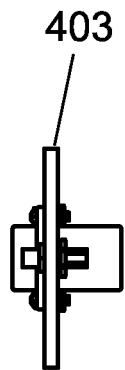 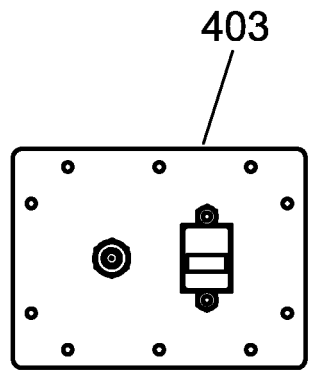
Fig. 16  Fig. 17
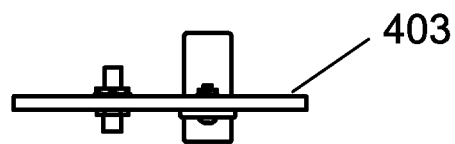
Fig. 18

ELECTROMAGNETICALLY SHIELDED ENCLOSURE WITH OPERABLE INTERFACES

CROSS REFERENCE TO RELATED PATENT APPLICATIONS

This application claims priority to U.S. Patent Application Ser. No. 61/451,069 filed Mar. 9, 2011 entitled "Electromagnetically shielded enclosure with operable interfaces" by Winch and Smith. The disclosure of this U.S. Patent Application Ser. No. 61/451,069 is incorporated herein by reference in its entirety.

BACKGROUND OF THE INVENTION

1. Field of the Invention

This invention relates generally to electromagnetic shielding, and more specifically to an electromagnetically shielded enclosure having operable interfaces.

2. Description of Related Art

With the proliferation of electronic devices that rely on radiofrequency communications there is also a growing use of electronic devices in illegal activities. Electronic devices seized by law enforcement or military personnel can provide valuable information, and can help to reconstruct events that took place during a crime, a military operation, or the like. Once an electronic device is obtained from a crime scene or as part of an investigation, it is important to secure the electronic device and prevent the device from receiving further calls, text messages, emails, updates, or otherwise accessing a cellular, GPS, or other radiofrequency network. Such radiofrequency network access could destroy or alter the information contained in the device that may otherwise become important evidence. One recent technique to prevent access to a radiofrequency network by a seized or otherwise secured electronic device is to place the device in a radiofrequency shielded container, essentially a faraday cage, to cut off further communication. The radiofrequency shielded container may be a metal box, a metal bag, a metalized fabric bag, or the like. The radiofrequency shielded enclosure is of a size adequate to accommodate the seized electronic device, and is fully closed such that a faraday cage structure surrounds the electronic device, cutting off any further radiofrequency communications.

Once the electronic device has been secured and is shielded from any further communications, it is typically taken to a forensics lab where the device is placed in a radiofrequency shielded room or enclosure to allow a technician to access the data contained in the secured electronic device. The electronic device must therefore move from a radiofrequency shielded enclosure such as a shielded forensics bag to a lab based radiofrequency shielded room or enclosure that will allow a technician access to the secured device. Such transfer is problematic in many ways. There is a risk of corruption of data where a signal accesses or is transmitted from the device during the move from the forensics bag to the shielded room. Evidence tampering is also a concern whenever evidence such as an electronic device is moved from an evidence bag or pouch into another location. In addition, removing the electronic device from the forensics bag or pouch and transferring it to a radiofrequency tight lab setting is also labor intensive and prone to delays and personnel issues. To complicate matters, providing cabling from a radiofrequency tight forensics pouch or bag to the outside world creates a signal path where a radiofrequency signal can traverse. Even more difficult is the operation of the electronic device within the radiofrequency tight forensics pouch. While windows or shielded features may allow a technician to push buttons on the electronic device, the proliferation of touch screen displays creates an even bigger challenge to operating the electronic device within the radiofrequency tight forensics pouch.

There heretofore has been no known way to allow a technician to access and operate many of the configurations of electronic devices currently on the market in the originally secured forensics bag or pouch, and further have the capability to transfer data from the electronic device to another media or device for storage and analysis purposes. Touch screen displays and interfaces have been particularly challenging to operate within a forensics bag or pouch.

It is thus an object of the present invention to provide an electromagnetic enclosure that is compact and easily portable and allows access and operation of the device while contained in the enclosure. It is another object of the present invention to provide an electromagnetic enclosure that is portable and allows touch screen tactile control of the electronic device while contained in the enclosure. It is yet another object of the present invention to provide an electromagnetic enclosure that is portable and allows for interfacing connections to the device while contained in the enclosure. It is another object of the present to invention to provide an electromagnetic enclosure that is portable and provides filtered interface connections to allow radiofrequency shielded connections to the device while contained in the enclosure. It is another object of the present invention to provide an electromagnetic enclosure that is portable and has an interior frame for touch screen operation that can be rolled up or compressed for storage along with the electromagnetic enclosure.

BRIEF SUMMARY OF THE INVENTION

In accordance with the present invention, there is provided an electromagnetically shielded enclosure with operable interfaces, the enclosure comprising a pouch of shielding material, a radiofrequency tight window located on a side of the pouch, an input/output assembly located on a side of the pouch and having electrical connections there through, an opening in the pouch, and a fastener located proximate said opening in the pouch that creates a radiofrequency tight seal.

The foregoing paragraph has been provided by way of introduction, and is not intended to limit the scope of the invention as described in this specification, claims, and the attached drawings.

BRIEF DESCRIPTION OF THE DRAWINGS

The invention will be described by reference to the following drawings, in which like numerals refer to like elements, and in which:

FIG. 15 is a perspective view of the exterior plate of the input/output assembly;

FIG. 16 is a vertical side view of the exterior plate of the input/output assembly;

FIG. 17 is a plan view of the exterior plate of the input/output assembly;

FIG. 18 is a horizontal side view of the exterior plate of the input/output assembly;

Figure 1:
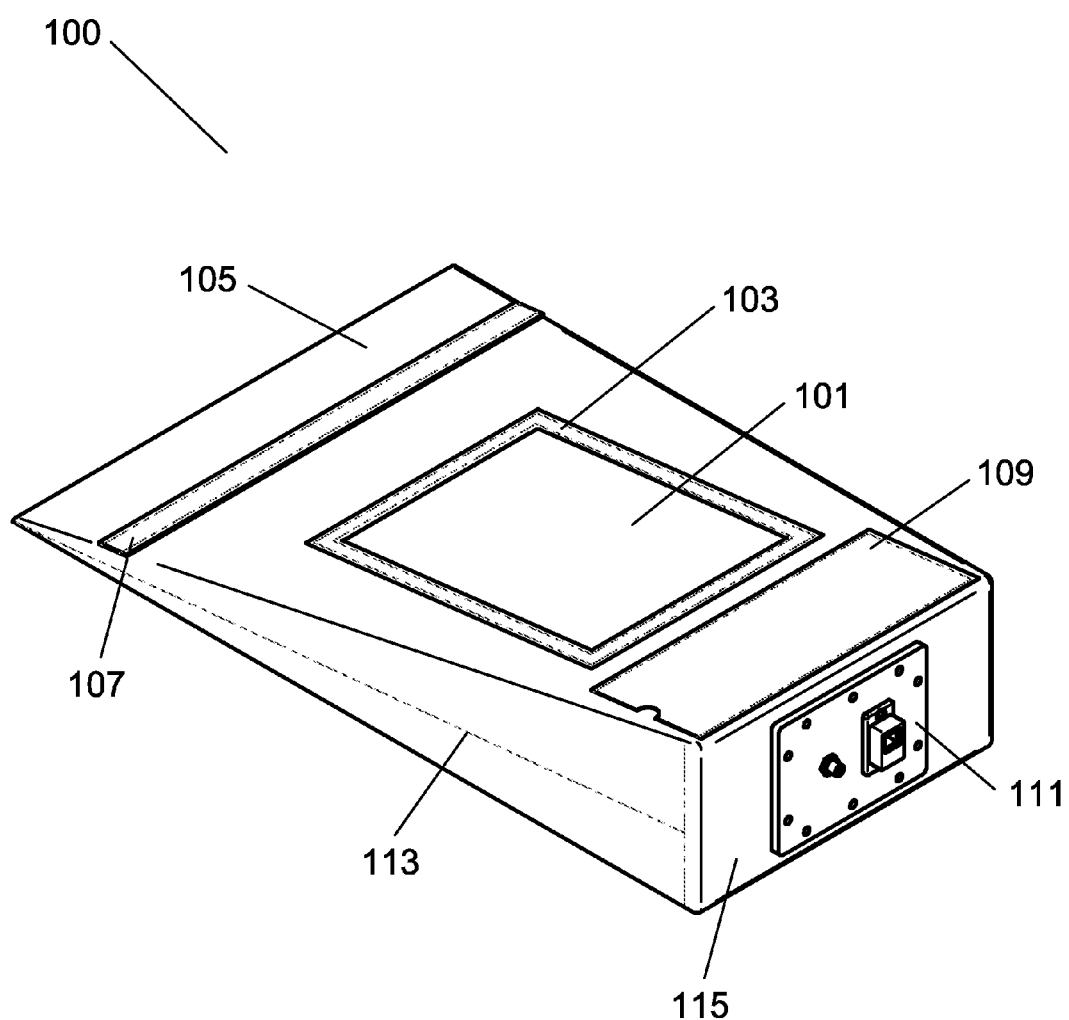
FIG. 1 is a perspective view of an electromagnetically shielded enclosure with operable interfaces.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, attached drawings and claims.

DESCRIPTION OF THE PREFERRED EMBODIMENTS

The Electromagnetically shielded enclosure with operable interfaces provides a forensic style pouch or bag with several novel features to allow operation of a secured electronic device without the need for the secured device leaving the confines of the electromagnetically shielded enclosure. An input/output assembly provides electrical feed-through connections. To prevent ingress and egress of unwanted radiofrequency signals, a filtering arrangement may be provided in some embodiments. A radiofrequency shielded tactile window provides touch screen user interface access to the secured electronic device. To reduce or eliminate unwanted interference from the conductive tactile window of the present invention, an optional internal frame is provided to create a trampoline style structure that provides a tactile point without associated interference from the non-tactile portion of the shielded tactile window. In some embodiments of the present invention, the optional internal frame may be made from a soft compressible material that allows the internal frame to be stowed along with the forensics pouch or bag. Geometries, placement of components, and related attributes of the present invention may change based on a given application. Such adaptations and modifications will become evident to one skilled in the art after reading this specification and claims, and viewing the attached drawings, and are considered part of the present invention and the various embodiments of the present invention described and envisioned herein.

For a general understanding of the present invention, reference is made to the drawings. In the drawings, like reference numerals have been used throughout to designate identical elements.

Turning now to FIG. 1, a perspective view of an electromagnetically shielded enclosure with operable interfaces is shown. A pouch or similar enclosure 100 is depicted that is made from a shielding material 115 such as a metalized woven textile, or in the alternative, a conductive mesh, screening, sheet, or the like. An example of such a metalized woven textile is a silver plated woven nylon ripstop fabric sold under the tradename ProTex Ag by Carolina Silver Technologies of Maiden, N.C. In some embodiments of the present invention, the fabric may be fire retardant or treated with a fire retardant coating or impregnation. An example of a flame retardant coating is a dispersion of halogenated hydrocarbon and antimony trioxide with latex binder, such as Apex Backote #7245 made by Apexical, Inc. of Spartansburg, S.C. Construction of the electromagnetically shielded enclosure with operable interfaces is done primarily by use of fastening techniques such as stitching, use of adhesives, or the like. Secondary operations such as attaching a connector, input/output assembly, or the like to the electromagnetically shielded enclosure with operable interfaces will become clear after reading the remainder of this specification with the accompanying drawings.

Figure 5:
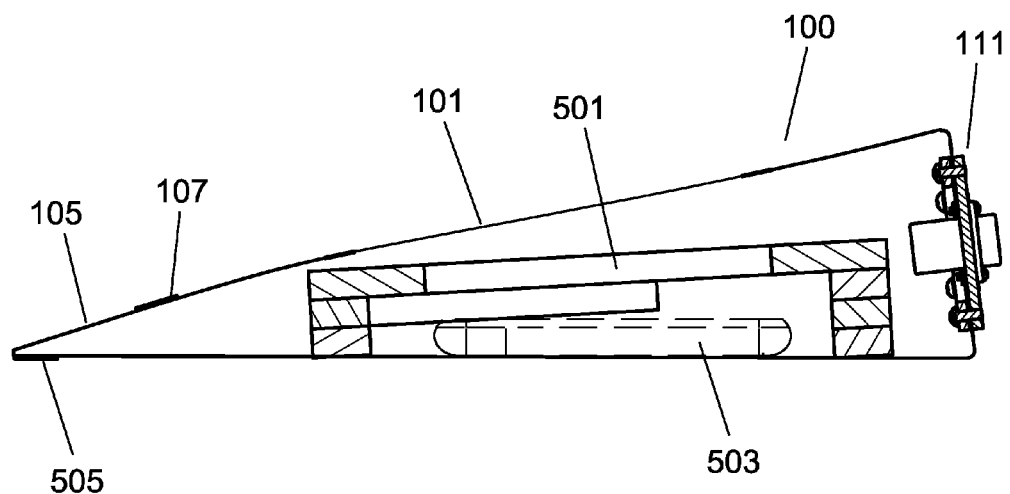
FIG. 5 is a cross sectional view taken along line a-a of FIG. 2.
Figure 6:
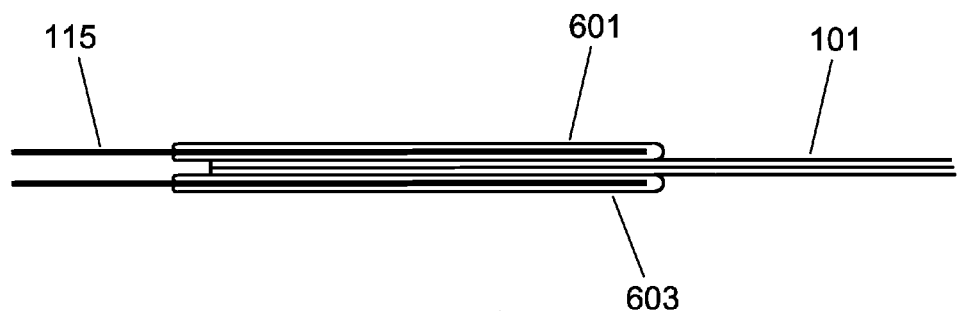
FIG. 6 depicts an exemplary construction of the tactile window edge.

The enclosure 100 comprises a shielded tactile window 101. The shielded tactile window 101 is made from a conductive mesh, loose weave metalized woven textile, or the like. An example of such a loose weave metalized textile is a silver plated nylon warp knitted fabric sold under the trade name Salem Antibacterial Fabric manufactured by Carolina Silver, LLC of Maiden, N.C. In some embodiments of the present invention, the shielded tactile window 101 comprises two or more layers of material such as loose weave metalized woven textile. The composition of the shielded tactile window being such to allow adequate viewing of the secured electronic device contained within the enclosure 100 and also to allow for tactile interface to a touch screen, control knobs, buttons, switches, and the like. In some embodiments of the present invention, a clear cover such as a clear vinyl cover may cover the shielded tactile window 101 to provide a contamination proof, weather proof, or weather resistant barrier. Tactile interface to the secured electronic device may be accomplished through the tactile window 101 or through the shielding material 115. In some embodiments of the present invention, the tactile window 101 may be omitted. In constructing the present invention, the shielded tactile window 101 is fastened to an opening in the enclosure 100 through a perimeter seal 103 that may include, for example, tape, adhesive, fabric, stitching, conductive hook and loop fasteners, or the like. An example of a perimeter seal 103 that comprises a fabric bias structure is depicted in FIG. 6, and will be described later in this specification. FIG. 1 also depicts a foldover flap 105 that has a fastener 107 to provide secure radiofrequency tight closure of the enclosure 100. The fastener 107 may be a hook and loop fastener, a conductive hook and loop fastener, a magnetic strip, a zipper, a conductive zipper, or the like. FIG. 5 shows the fastener mating surface 505 that may be a mate to the fastener 107, and may be a hook and loop fastener, a conductive hook and loop fastener, a magnetic strip, a zipper, a conductive zipper, or the like. To use the enclosure 100, once a secured electronic device is placed within the confines of the enclosure 100, the foldover flap 105 is tightly rolled and the fastener 107 and the fastener mating surface 505 are aligned and connected such that a radiofrequency tight seal is made. FIG. 1 also depicts an optional identification holder 109 that comprises a clear sleeve to accommodate a tag, label, or other identifying material. The enclosure 100 also has an input/output assembly 111 that will be further described by way of FIGS. 11-18. The input/output assembly 111 comprises a conductive structure having through connectors to provide electrical access to the secured electronic device contained within the enclosure 100 while in use, and provides a means to transfer data from or to the device, electronically communicate with the secured device, charge the secured device, and the like. The through connectors of the input/output assembly 111 may vary in type, quantity, size, and other attributes depending on the intended application. The construction of the enclosure 100 also provides a seam 113 for structural definition. In some embodiments of the present invention, the seam 113 is omitted or repositioned.

Figure 2:
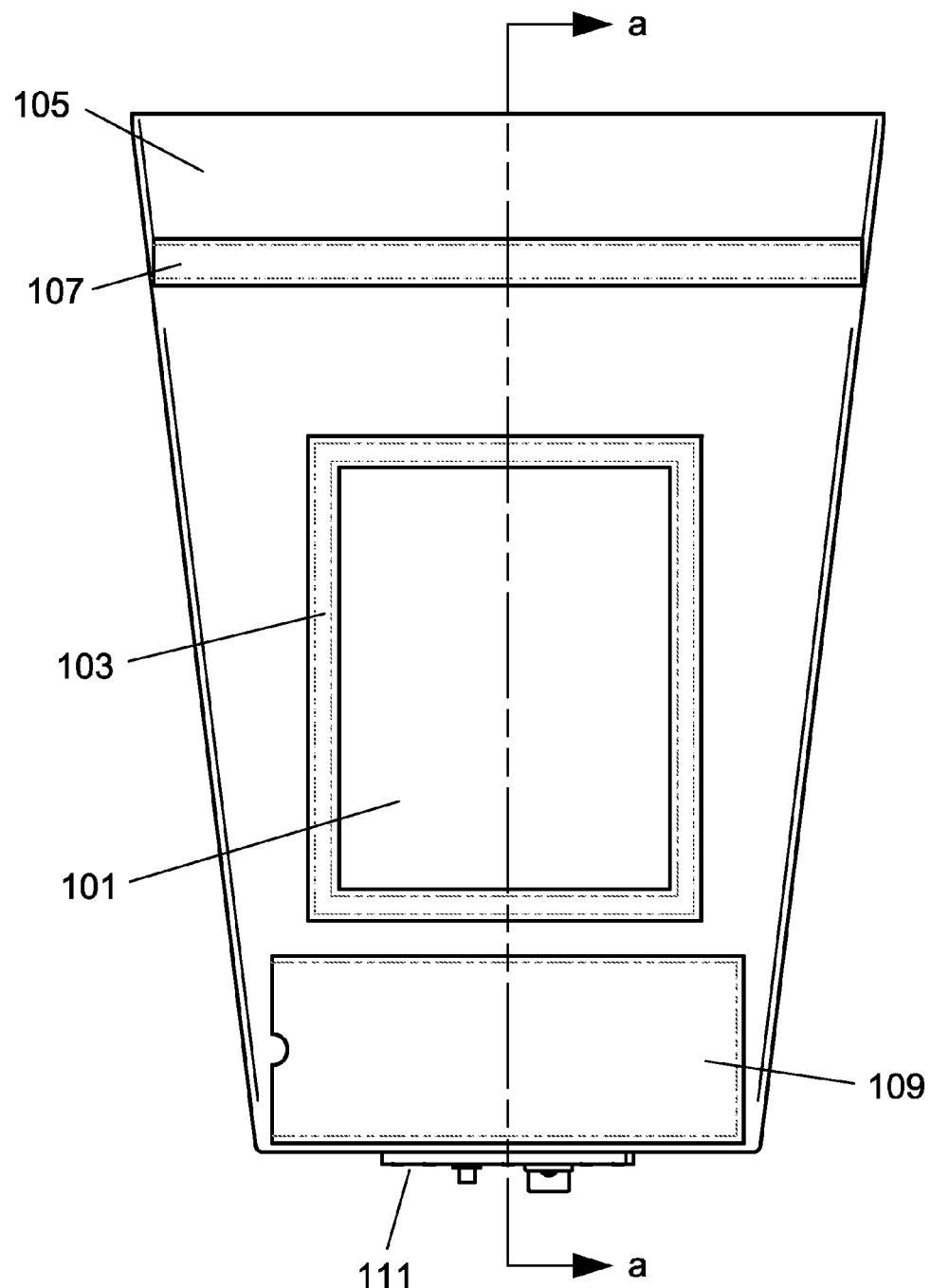
FIG. 2 is a top plan view of an electromagnetically shielded enclosure with operable interfaces.

FIG. 2 is a top plan view of an electromagnetically shielded enclosure with operable interfaces. The shielded tactile window 101 may be rectangular, or may be square or other geometries. The fastener 107 can be clearly seen on the foldover flap 105. A cut line a-a is depicted that relates to the cross sectional view of FIG. 5 to provide a view of the interior of the enclosure and related construction thereof.

Figure 3:
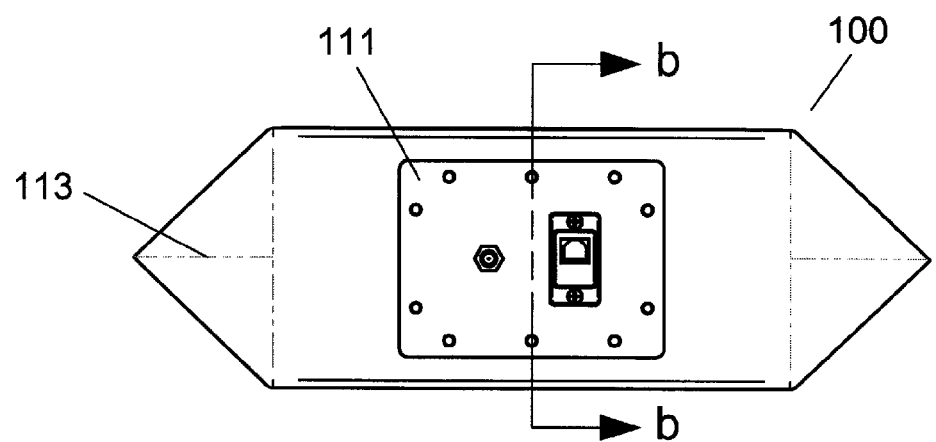
FIG. 3 is a plan view of the input/output side of an electromagnetically shielded enclosure with operable interfaces.
Figure 4:
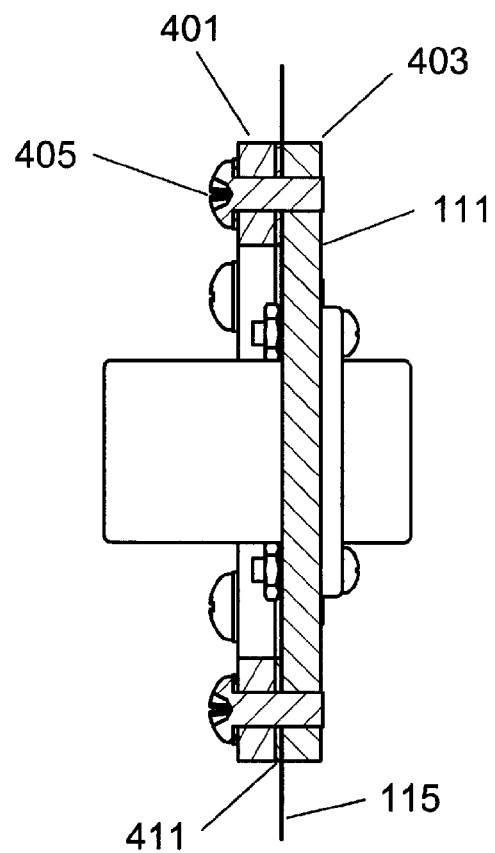
FIG. 4 is a cross sectional view taken along line b-b of FIG. 3.

FIG. 3 is a plan view of the input/output side of an electromagnetically shielded enclosure with operable interfaces. Shown in FIG. 3 is a cut line b-b to provide an exemplary view of construction related details of the input/output assembly 111 and its assemblage and fit to the enclosure 100. As seen in FIG. 3, the input/output assembly contains several connectors. The connectors depicted are a USB connector and a radiofrequency connector, but the specific connector types and quantities may change depending on the application of the enclosure. Other connectors may be data connectors, power and charging connectors, radiofrequency connectors, and the like. FIG. 4 is a cross sectional view of the input/output assembly taken along line b-b of FIG. 3. The construct described herein is exemplary, and may be modified or otherwise altered by those skilled in the art and still remain within the spirit and scope of the present invention and the various embodiments described herein. The input/output assembly 111 is an assembly comprising an interior frame 401 and an exterior plate 403. The plates may be made from a metal such as aluminum, steel, stainless steel, copper, brass, or the like. Other embodiments may employ various plastics that provide shielding effectiveness, such as a plastic such as a polypropylene or polystyrene containing metal particles or shavings, a plastic having a metallic layer or covering, or the like. Other materials may include composites, conductively coated materials, graphene, carbon nanotube based materials, and the like. Features such as plate geometries, hardware, and placement and quantity of plates may vary based on application, these modifications, additions or subtractions being within the intellectual grasp of those skilled in the art, and therefore being considered embodiments of the present invention. FIGS. 11-18 provide further views of the exemplary input/output assembly components that are described herein by example, and not limitation. The interior frame 401 and the exterior plate 403 are placed on either side of a properly sized hole that is cut or otherwise formed in the enclosure. The opening in the enclosure in one embodiment is slightly smaller than the input/output assembly 111 to allow for good electrical contact and to allow the fastened electrical connectors to pass through the enclosure walls. The interior frame 401 and the exterior plate 403 are placed on their respective sides of the enclosure and fastened together by way of fasteners 405 such as screws, bolts, rivets, or the like. Prior to assembly of the interior frame 401 and the exterior plate 403 a gasket 411 may, in some embodiments of the present invention, be placed on the perimeter of either the frame or the plate, or both. The gasket can be further seen in FIG. 14, and in one embodiment of the present invention, is a conductive tape such as the rectangular metalized fabric gasket material manufactured by Tech-Etch of Plymouth, Mass. Other fabric over foam tapes may be used, as well as impregnated rubber, wire mesh finger stock, composite foams, and the like. Similar materials that provide radiofrequency coupling and shielding may be used. For example, an open cell polyurethane foam with a metalized fabric covering comprising a nickel plating over a copper substrate fabric. FIG. 4 also shows the shielding material 115 that comprises the enclosure itself.

FIG. 5 is a cross sectional view of the enclosure taken along line a-a of FIG. 2. The foldover flap arrangement can be clearly seen including the foldover flap 105 and the fastener 107 and the fastener mating surface 505. The fastener 107 and the fastener mating surface 505 may be a hook and loop fastener pair, a conductive hook and loop fastener pair, a to magnetic pair, or the like. To close the enclosure, the open end of the enclosure is folded or rolled until the fastener 107 and the fastener mating surface 505 make contact and result in a seal that is radiofrequency tight and mechanically sound. Further depicted in FIG. 5 is an optional internal frame 501 that provides for the proper functioning of a touch screen interface on a secured electronic device 503. It should be noted that the internal frame 501 is optional. It's use being dictated by not only the presence of a secured electronic device having a touch screen interface, but also by compatibility requirements for certain touch screens, as some touch screens will operate properly without the need for the internal frame 501, while others will malfunction upon receiving contact from multiple points on the shielded tactile window 101. The shielded tactile window 101 depicted in FIGS. 1 and 2 may interfere with the proper operation of a touch screen interface on a secured electronic device 503, as the shielded tactile window 101 does not provide an isolated point of contact to a touch screen, but rather, makes contact with a majority of (or multiple points of) the touch screen surface. This interference results in improper operation of the touch screen of the secured electronic device. The internal frame 501 therefore creates a mechanical structure that keeps the majority of the shielded tactile window off of the touch screen, and allows for an isolated point of contact by way of a finger touch, and eliminates interference and improper operation. FIGS. 7-10 provide additional views and details of an exemplary embodiment of the internal frame 501.

In constructing the electromagnetically shielded enclosure with operable interfaces, a variety of construction techniques may be used to join the fabric and the various components together. Stitching and adhesives provide several exemplary techniques. FIG. 6 depicts an exemplary construction of the present invention as may be used in installing the shielded tactile window 101 into an opening fabricated in the shielding material 115. In FIG. 6, a first bias 601 and a second bias 603 are depicted that wrap the shielding material ends and capture both sides of a two layer shielded tactile window 101 prior to stitching or other fastening technique. A bias is a folded piece of fabric that is stitched or otherwise fastened in place and covers all exposed cut edges, thus preventing fraying or other unraveling or deconstruction of the material.

Figure 7:
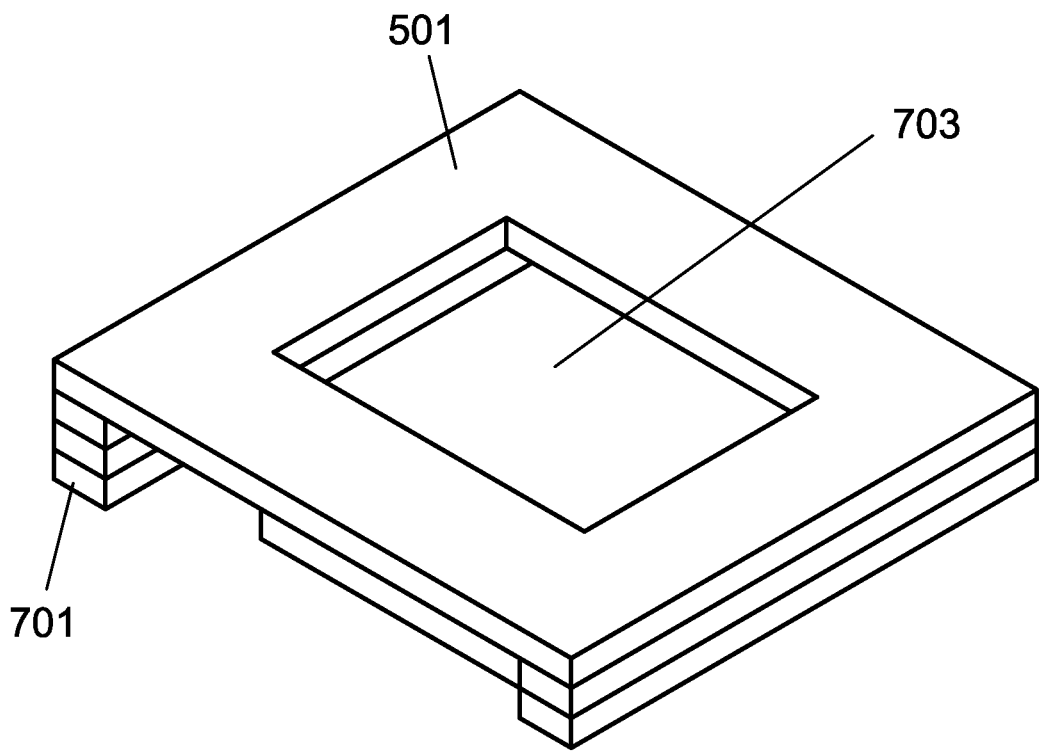
FIG. 7 is a perspective view of the internal frame for touch screen control.
Figure 8:
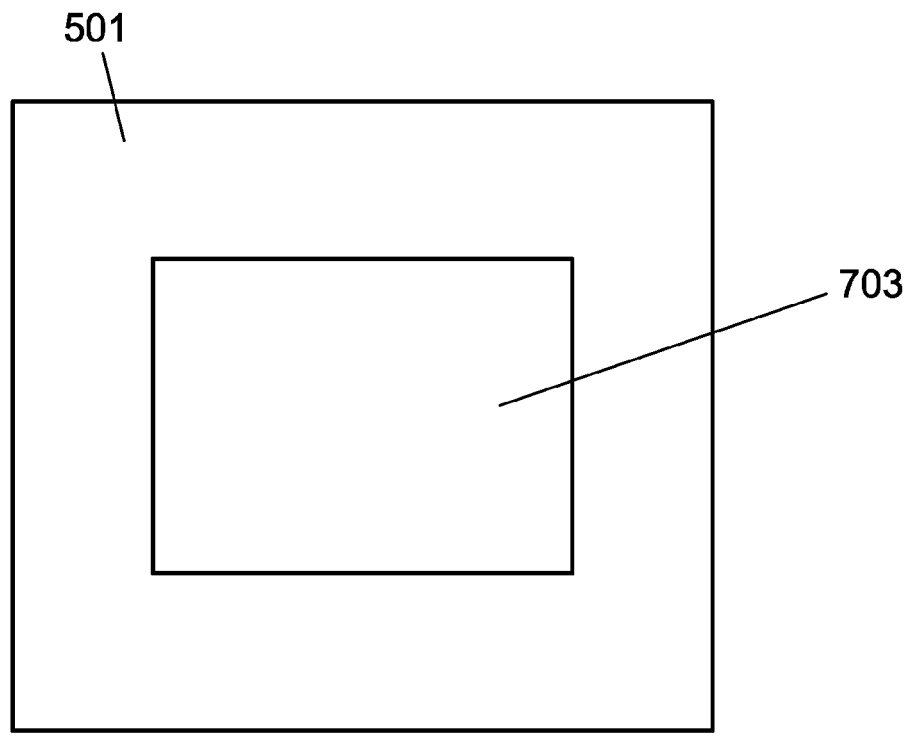
FIG. 8 is a top plan view of the internal frame for touch screen control.
Figure 9:
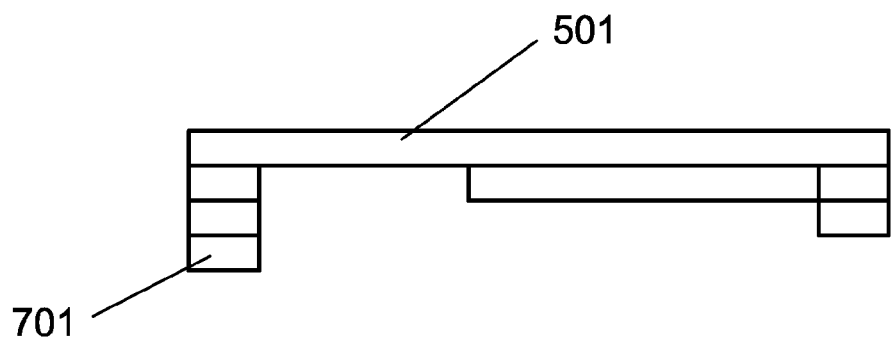
FIG. 9 is a side view of the internal frame for touch screen control.
Figure 10:
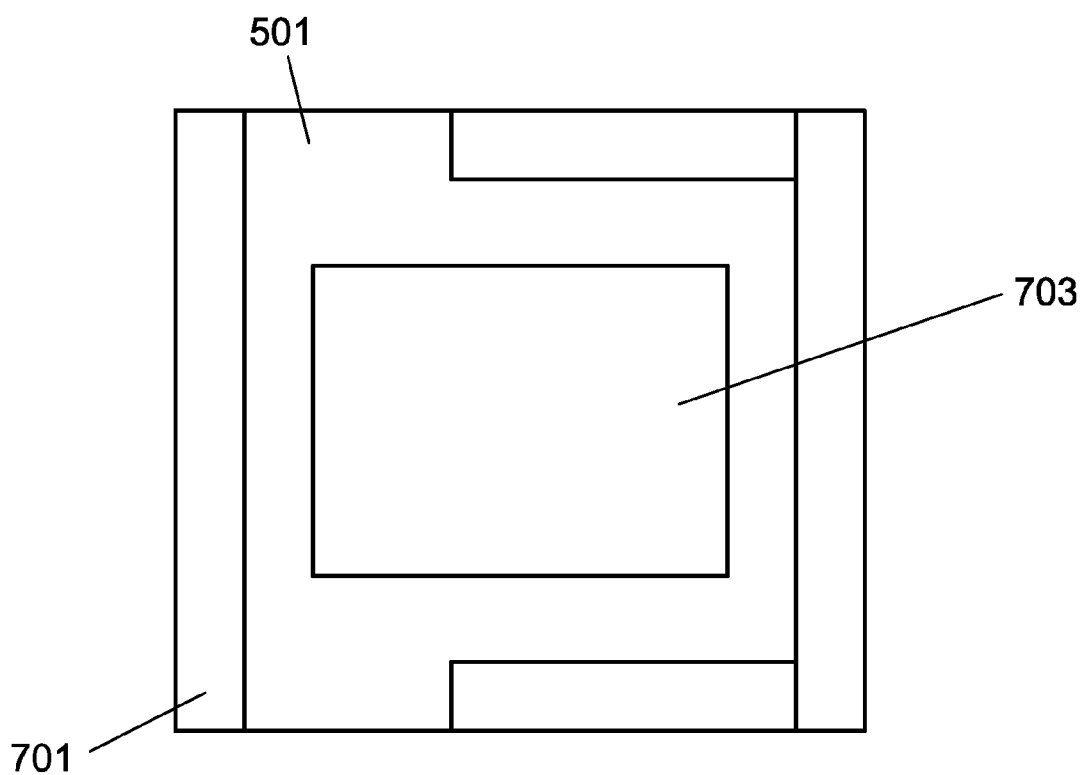
FIG. 10 is a bottom plan view of the internal frame for touch screen control.

Turning now to FIG. 7, a perspective view of the optional internal frame for touch screen control 501 is depicted. The frame may be made of a sheet foam material such as the cellular foams manufactured by Pregis Corporation of Deerfield, Ill. As can be seen in FIG. 7, an operating aperture 703 creates a trampoline type structure when in contact with the shielded tactile window, thus isolating contact points for proper touch screen operation of a secured electronic device. The internal frame 501 may be built up or otherwise formed by stacking layers of a sheet foam material 701, or may, in some embodiments of the present invention, be cut from a single piece of material, cast, molded, or otherwise formed during manufacture. In a layered construction approach, the various layers of sheet foam material are fastened using an adhesive or a tape such as a modified acrylic transfer tape. An example of such a modified acrylic transfer tape is the 9485PC adhesive transfer tape with adhesive 350 by 3M™ of Saint Paul, Minn. For complete understanding of the construction and use of an exemplary internal frame for touch screen control, FIG. 8 is a top plan view of the internal frame for touch screen control. FIG. 9 is a side view of the internal frame for touch screen control, and FIG. 10 is a bottom plan view of the internal frame for touch screen control. Other mechanical assemblies that provide an internal frame with an operating aperture forming a trampoline type structure may also be used. For example, inflatable bladders or similar structures may be used to make a portable internal frame that is either independent of the electromagnetically shielded enclosure with operable interfaces or is built into the fabric or a related part of the electromagnetically shielded enclosure with operable interfaces. A bias may comprise two separate pieces of material, or may be one piece having an accordion fold. Other materials that may be soft, compressible, and stowable, may also be used.

Figure 11:
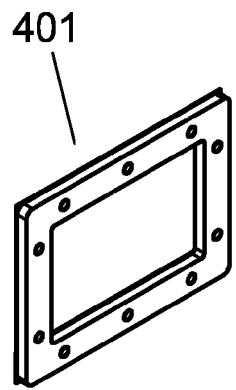
FIG. 11 is a perspective view of the interior frame of the input/output assembly.
Figure 12:
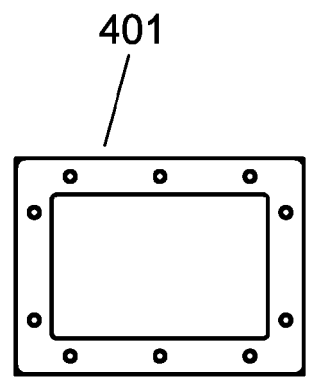
FIG. 12 is a plan view of the interior frame of the input/output assembly.
Figure 13:
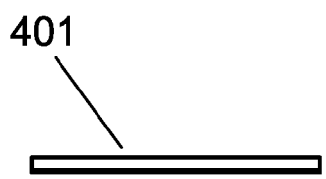
FIG. 13 is a side view of the interior frame of the input/output assembly.
Figure 14:
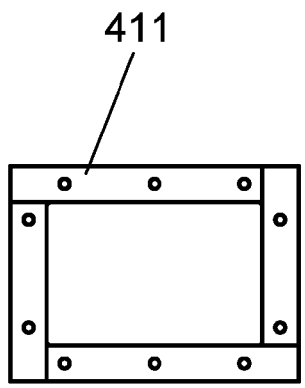
FIG. 14 is a plan view of the gasket for the interior frame.

Returning now to the input/output assembly as previously described and depicted in FIG. 1, the various constituent components of the input/output assembly are seen in FIGS. 11-18. The interior frame 401 and the corresponding exterior plate 403 are depicted along with the gasket 411. FIG. 11 is a perspective view of the interior frame of the input/output assembly, FIG. 12 is a plan view of the interior frame of the input/output assembly, and FIG. 13 is a side view of the interior frame of the input/output assembly. The interior frame 401 contains an opening to allow wires, cables, and connectors to pass through. FIG. 14 is a plan view of the gasket for the interior frame. FIG. 15 is a perspective view of the exterior plate of the input/output assembly. FIG. 16 is a vertical side view of the exterior plate of the input/output assembly. FIG. 17 is a plan view of the exterior plate of the input/output assembly, and FIG. 18 is a horizontal side view of the exterior plate of the input/output assembly. Holes are also seen along the periphery of the interior frame 401 that line up with the holes seen in FIGS. 15 and 17 of the exterior plate 403 to receive fasteners such as bolts, rivets, or the like and properly mate the interior frame 401 to the exterior plate 403, creating a radiofrequency tight seal with the shielding material that comprises the electromagnetically shielded enclosure with operable interfaces. A gasket 411, as seen in FIG. 14, may also be used to facilitate proper radiofrequency sealing. In one embodiment of the present invention, the gasket is a conductive tape such as the rectangular metalized fabric gasket material manufactured by Tech-Etch of Plymouth, Mass. Similar materials that provide radiofrequency coupling and shielding may also be used. For example, an open cell polyurethane foam with a metalized fabric covering comprising a nickel plating over a copper substrate fabric. It should be noted that the input/output assembly 111 may be made from more than two or less than two plates, and may be made from various conductive materials and use various fasteners and electrical connectors.

Figure 19:
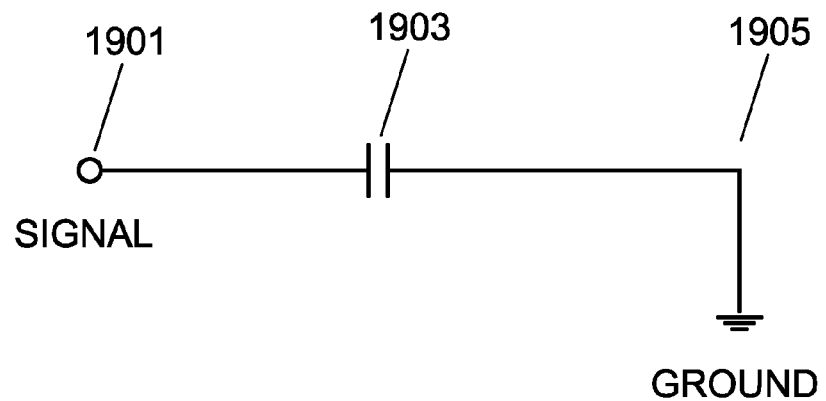
FIG. 19 is a simplified schematic of a filter assembly of one embodiment of the present invention.
Figure 20:
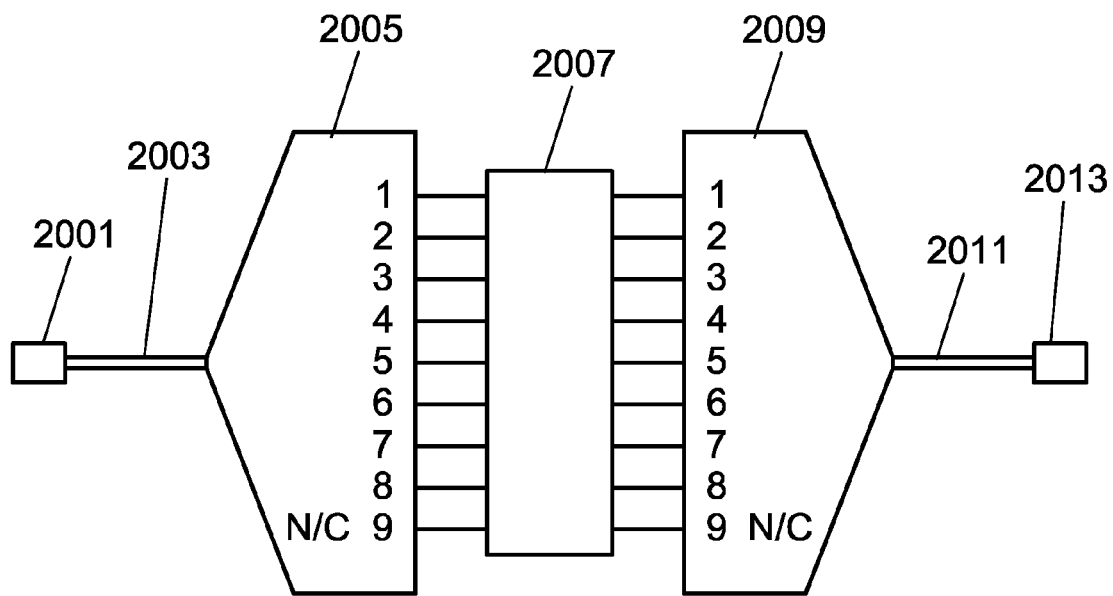
FIG. 20 is an example of a cabling diagram of a filter assembly of one embodiment of the present invention.

In some embodiments of the present invention, a filter or multiple filters may be electrically connected to a connector or multiple connectors that provide signal or power transfer in and out of the electromagnetically shielded enclosure with operable interfaces. An example of a filter is a passive component filter such as a capacitor. Other embodiments of the present invention may employ other passive components, or may use active filtering techniques such as semiconductor based filters. Such filters prevent unwanted signals from entering or leaving the electromagnetically shielded enclosure with operable interfaces. A simplified schematic of one example of such a filter arrangement is depicted in FIG. 19. A signal connection 1901 and a ground connection 1905 are electrically connected to a capacitive filter 1903. In this example, the ground connection 1905 may also be a second signal connection. An example of a capacitive filter 1903 is an 820 picofarad capacitor used to attenuate high frequency signals that may be present on the conductors of connectors or related cables. For example, an 820 picofarad capacitor will provide a minimum insertion loss of 40 decibels from 500 Megahertz and above, which covers the cellular frequencies of 700 Megahertz to 2100 Megahertz. In some embodiments of the present invention, filtering may be provided on power input or power output connections in addition to, or in place of filtering on signal connections. Such filtering may be integrated with or otherwise electrically connected to connectors such as the connectors present on the input/output assembly. In some embodiments of the present invention, filtering may be contained in a filter assembly that may be electrically connected to, or integrated with, a cable assembly. FIG. 20 is an example of a cabling diagram of a filter assembly of one embodiment of the present invention. In the example provided by way of FIG. 20, a CAT-5 connector 2001 and a CAT-5 connector 2013 terminate each end of the cable assembly depicted. A CAT-5 cable 2003 and a second CAT-5 cable 2011 are shown connected between each CAT-5 connector and a radiofrequency shielded D-Sub connector hood 2005 and 2009 respectively. Placed between each radiofrequency shielded D-Sub connector hood 2005 and 2009 is a capacitive filter assembly 2007. The capacitive filter assembly 2007 provides for a capacitor such as depicted in FIG. 19 between each corresponding pin or between each pin and ground. Other filtering techniques, arrangements and configurations will be evident to those skilled in the art after reading this specification and viewing the attached drawings.

Figure 21:
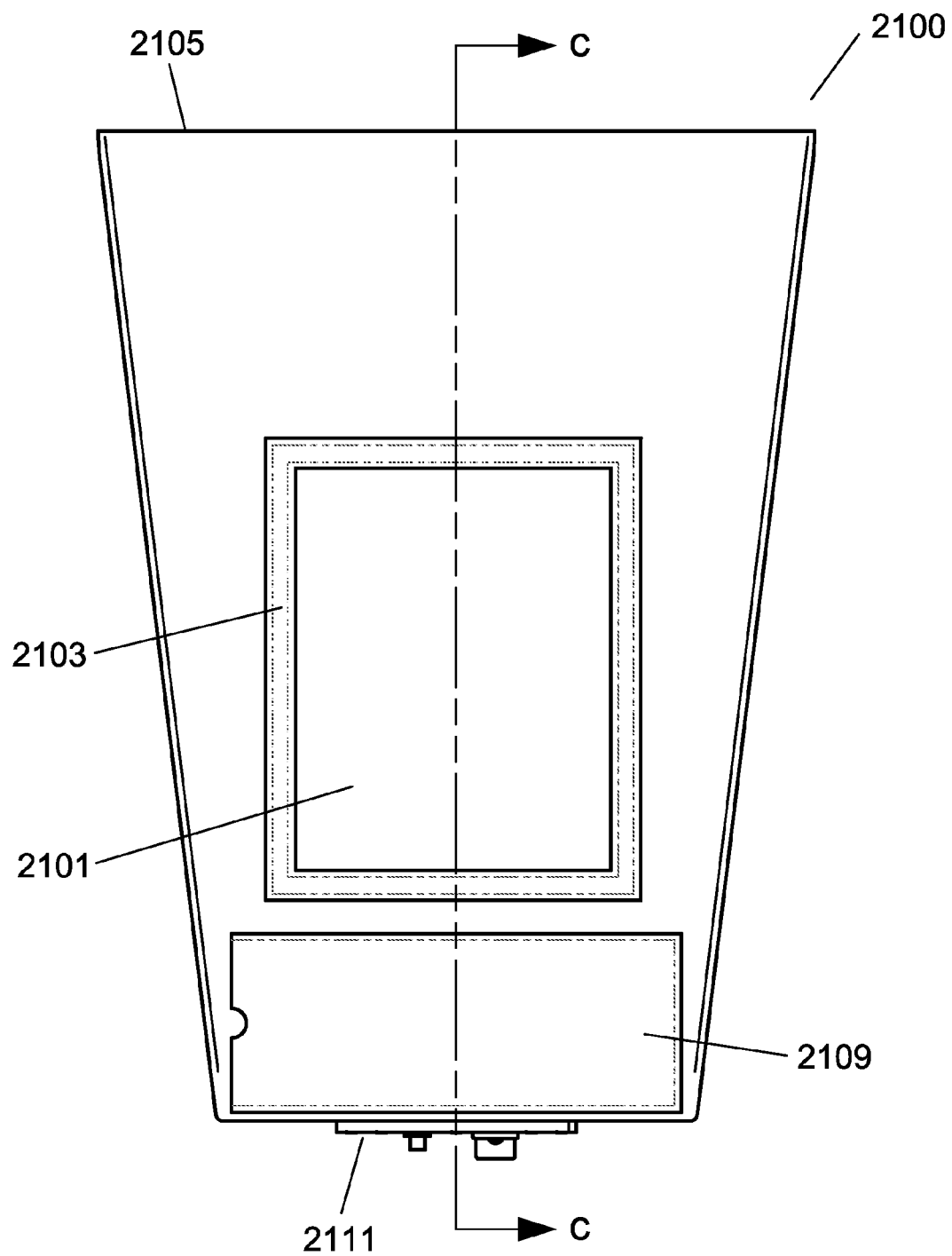
FIG. 21 is a top plan view of another embodiment of the electromagnetically shielded enclosure with operable interfaces.
Figure 22:
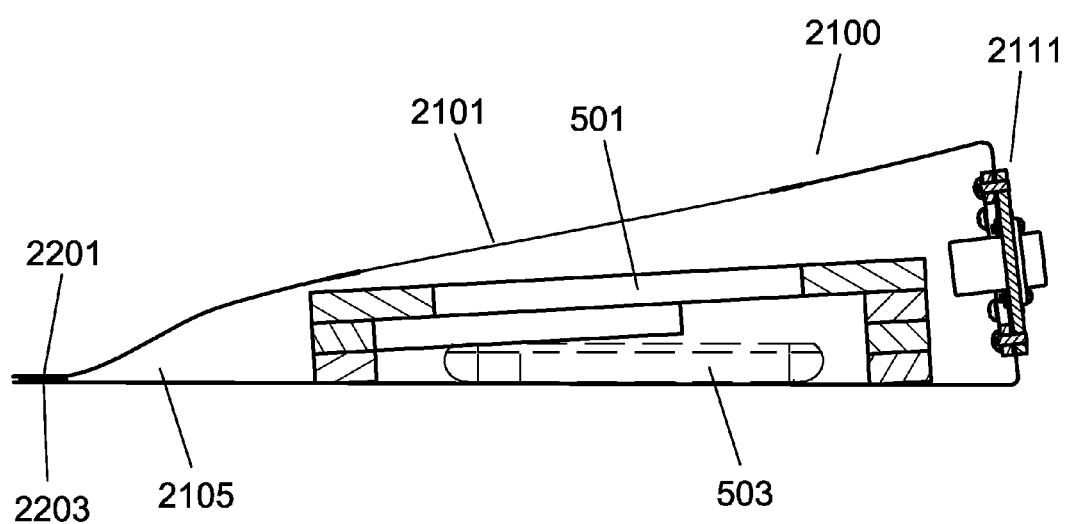
FIG. 22 is a cross sectional view taken along line a-a of FIG. 21.
Figure 23:
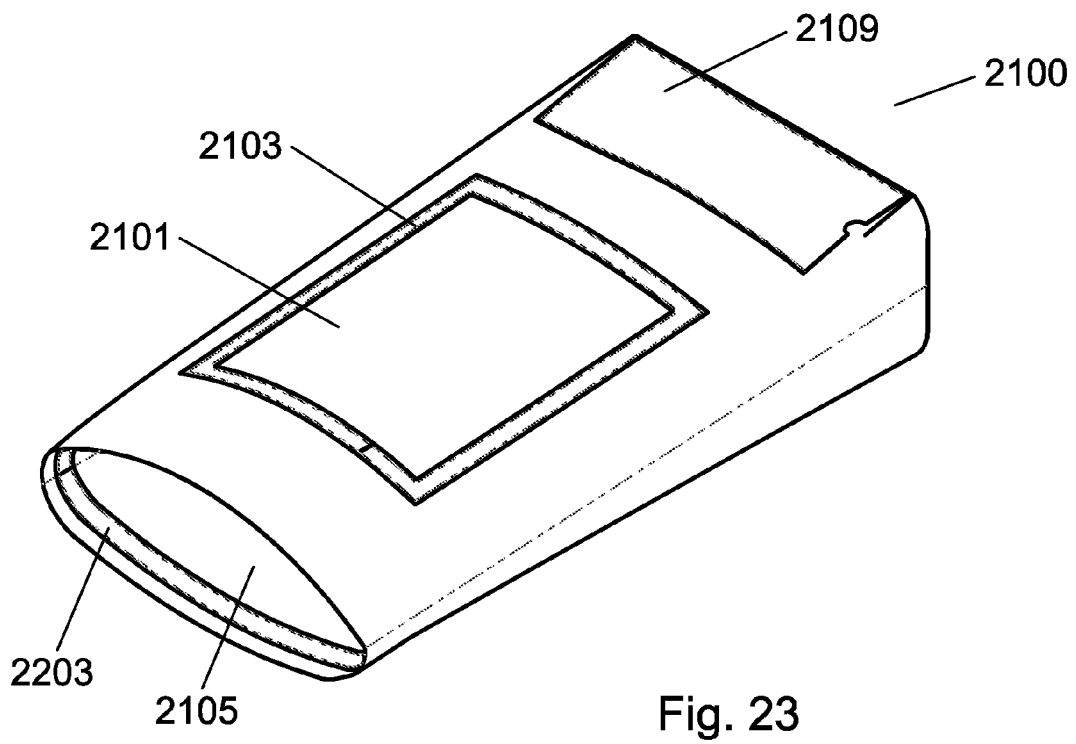
FIG. 23 is a top perspective view of another embodiment of the electromagnetically shielded enclosure with operable interfaces.
Figure 24:
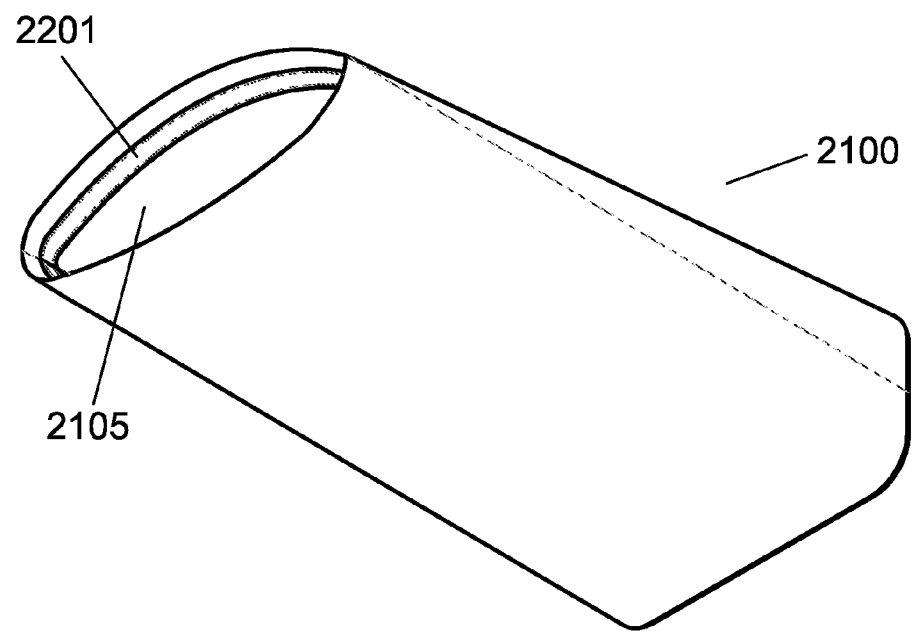
FIG. 24 is a bottom perspective view of another embodiment of the electromagnetically shielded enclosure with operable interfaces.

Various embodiments of the electromagnetically shielded enclosure with operable interfaces can be envisioned after reading this specification and viewing the attached drawings. For example, depicted in FIG. 21 is a top plan view of another embodiment of the electromagnetically shielded enclosure with operable interfaces 2100. Similar to that depicted in FIG. 2, a shielded tactile window 2101 is shown with a window perimeter seal 2103. The Electromagnetically shielded enclosure with operable interfaces 2100 further has an opening 2105 as well as an optional identification holder 2109 and an input/output assembly 2111. FIG. 22 is a cross sectional view taken along line c-c of FIG. 21. As previously described herein, the electromagnetically shielded enclosure with operable interfaces may have an internal frame 501 for facilitating the operation of an electronic device 503. In the embodiment depicted in FIGS. 22-25, however, the rollover flap 105 and related fastening arrangement depicted in FIG. 1 are not present. Instead, an upper opening fastener 2201 and a lower opening fastener 2203 are incorporated within the opening 2105. The upper opening fastener 2201 and the lower opening fastener 2203 may be a hook and loop fastener, a conductive hook and loop fastener, a magnetic strip, a zipper, a conductive zipper, or the like. In some embodiments of the present invention, there may be more than two, or less than two, fasteners. To further depict the embodiment of FIGS. 21 and 22, FIG. 23 is a top perspective view and FIG. 24 is a bottom perspective view.

Figure 25:
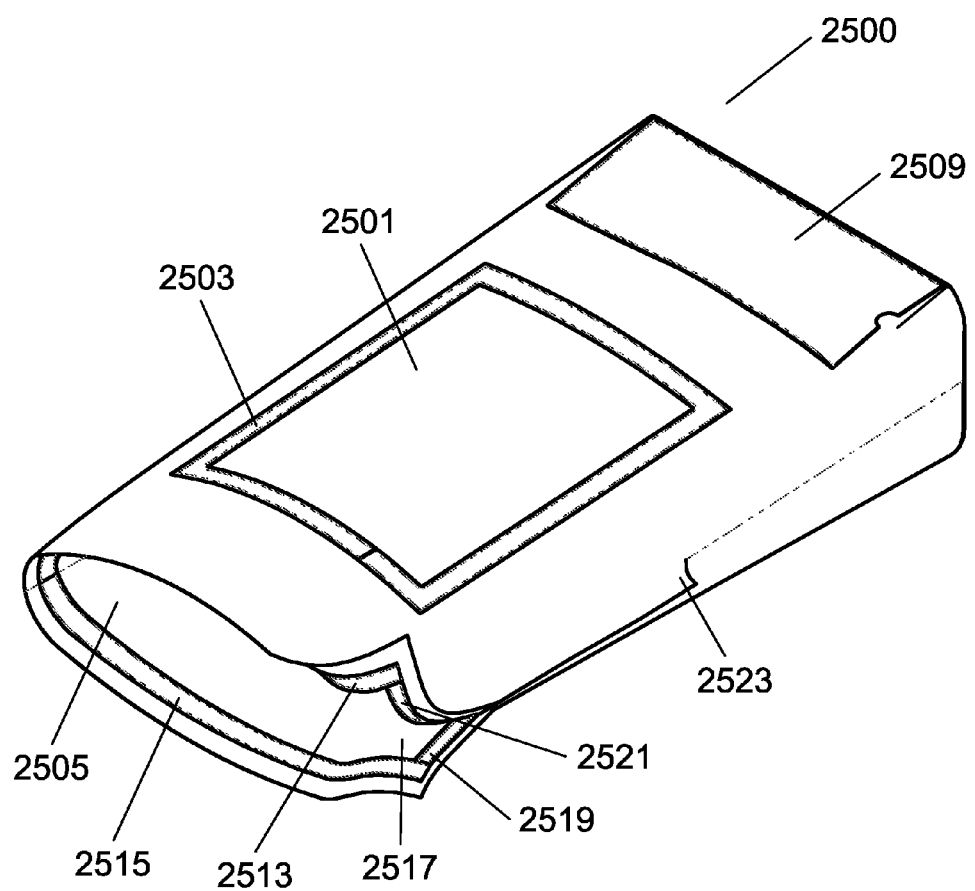
FIG. 25 is a top perspective view of another embodiment of the electromagnetically shielded enclosure with operable interfaces having a side opening.

To facilitate ease of use, other embodiments of the present invention may incorporate structural features to provide improved physical access, convenience, or the like. Various sizes and geometries of the enclosure itself as well as related elements such as the shielded tactile window may be employed without departing from the spirit and broad scope of the present invention as described, depicted, and envisioned herein. An example of such an embodiment is the addition of a side opening or several side openings. FIG. 25 is a top perspective view of such an embodiment of the electromagnetically shielded enclosure with operable interfaces. The electromagnetically shielded enclosure with operable interfaces and a side opening 2517 can be seen in FIG. 2500. Many of the elements having been previously described, the shielded tactile window 2501 has a window perimeter seal 2503, an opening 2505, an optional identification holder 2509, an upper opening fastener 2513 and a lower opening fastener 2515. It should be noted that while FIG. 25 depicts an opening arrangement similar to that of FIGS. 21-24, a foldover flap arrangement such as depicted in FIGS. 1-6 may also be employed. The side opening 2517 may be of a different length or to overall size than that depicted in FIG. 25. The side opening 2517 has a side opening lower fastener 2519 and a side opening upper fastener 2521, where may each be a hook and loop fastener, a conductive hook and loop fastener, a magnetic strip, a zipper, a conductive zipper, or the like. The placement of the side opening lower fastener 2519 may be on the inside of the electromagnetically shielded enclosure or on the outside of the electromagnetically shielded enclosure. In addition, the placement of the side opening upper fastener 2521 may be on the inside of the electromagnetically shielded enclosure or on the outside of the electromagnetically shielded enclosure. A side flap 2523 may be employed in some embodiments of the present invention to make the side opening easier to operate. The side flap 2523 may simply be cut from the same material as the enclosure is made from, or may be sewn or otherwise fastened in proximity to the side opening and may be the same or a different material. The side flap 2523 may also be loops, pull tabs, or similar Structures that are attached in proximity to the side opening to facilitate operation of the side opening. The side opening 2517 generally follows the transverse length of the electromagnetically shielded enclosure with operable interfaces, and may terminate at a predetermined distance from the opening 2505. This predetermined distance may be approximately 50% of the length of the electromagnetically shielded enclosure with operable interfaces, 25% of the length of the electromagnetically shielded enclosure with operable interfaces, 75% of the length of the electromagnetically shielded enclosure with operable interfaces, 100% of the length of the electromagnetically shielded enclosure with operable interfaces, or any reasonable distance that provides adequate functionality. Other geometries and locations for the side opening may also be employed in the present invention. FIG. 25 depicts the electromagnetically shielded enclosure with operable interfaces in the open position. To change to a closed position, the fasteners are simply connected or otherwise mated such that the electromagnetically shielded enclosure with operable interfaces presents an electromagnetically sealed environment.

Figure 26:
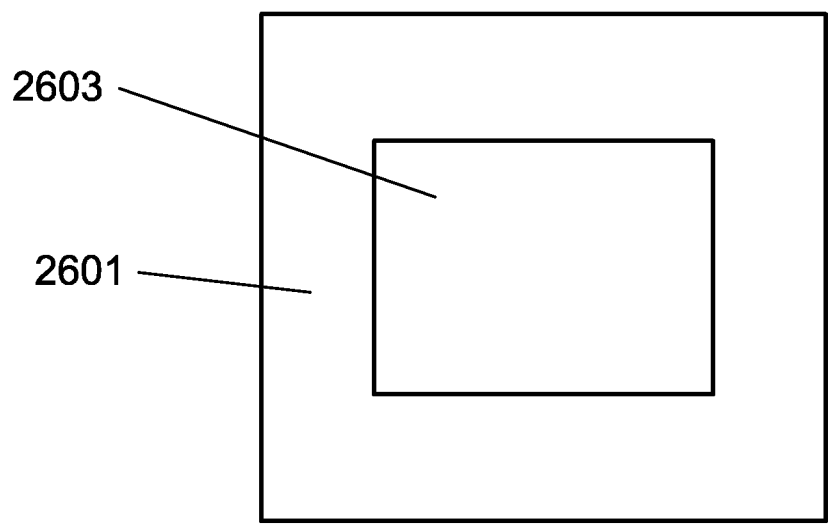
FIG. 26 is a plan view of a stowable internal frame for touch screen control.
Figure 27:
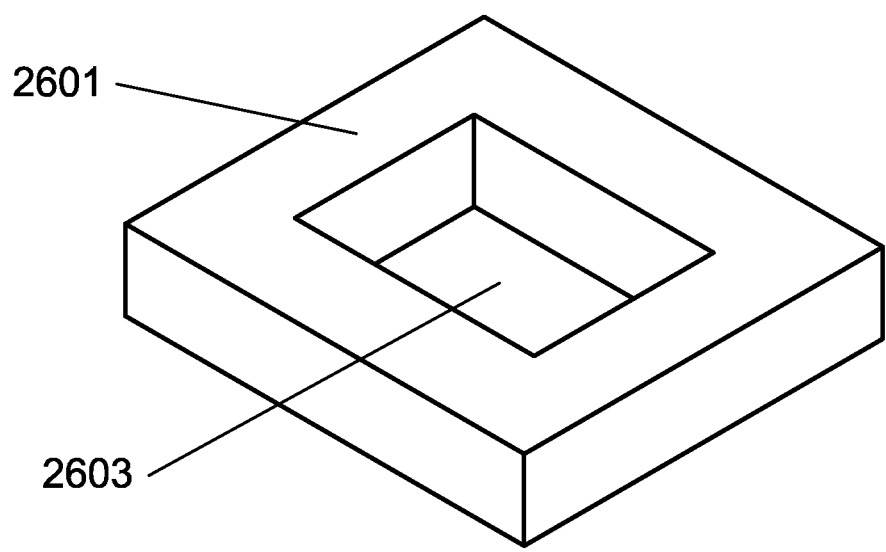
FIG. 27 is a perspective view of a stowable internal frame for touch screen control.

As previously described by way of FIGS. 7-10, an internal frame may be present in some embodiments of the present invention to create a trampoline type structure when in contact with the shielded tactile window, thus isolating contact points for proper touch screen operation of a secured electronic device. This internal frame arrangement is important for proper operation of many touch screen devices within the electromagnetically shielded enclosure with operable interfaces. Various alternative internal frame arrangements may also be employed, and are to be considered to be within the scope and spirit of the present invention as described and depicted herein. For example, the internal frame may be integral to the electromagnetically shielded enclosure with operable interfaces by way of adhesives, stitching, fabric compartments, or the like. The internal frame may also be made from inflatable air bladders that allow the overall electromagnetically shielded enclosure with operable interfaces to be more easily stored when not in use. In addition, various geometries and materials may be employed. For example, FIG. 26 is a plan view of a stowable internal frame for touch screen control and FIG. 27 is a perspective view of a stowable internal frame for touch screen control. The stowable internal frame 2601 as depicted in FIGS. 26 and 27 has an operating aperture 2603 where the electronic device is placed. The stowable internal frame 2601 may be made from a soft foam material such as a polyether open cell foam. Other embodiments may employ a closed cell foam or a similar open cell foam. The stowable internal frame 2601 being resilient so that when deformed for stowage, it will return to its original shape when put into use. The use of a soft foam material allows the internal frame to be rolled up or otherwise compressed, making for convenient storage, stowage, or transport.

To use the present invention, a secured electronic device is placed within the electromagnetically shielded enclosure with operable interfaces and the enclosure is sealed. The secured electronic device is now shielded from communications with the outside world, and can be operated using tactile means through the shielding material and/or optionally by way of a shielded tactile window, and signals and power can be brought in or out of the enclosure to connect with the secured electronic device without compromising radio silence.

It is, therefore, apparent that there has been provided, in accordance with the various objects of the present invention, an electromagnetically shielded enclosure with operable interfaces. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, claims, and the attached drawings.

What is claimed is:

1. An electromagnetically shielded enclosure with operable interfaces, the enclosure comprising:
    a pouch comprising shielding material;
    a radiofrequency shielded tactile window that provides a tactile feel through the radiofrequency shielded tactile window to a secured electronic device placed beneath the radiofrequency shielded tactile window, the radiofrequency shielded tactile window located on a side of the pouch;
    an internal frame having an operating aperture that accommodates the secured electronic device where in use the operating aperture is covered by the radiofrequency shielded tactile window to create a trampoline style structure that maintains space from the tactile window to a touch screen of the secured electronic device to isolate contact points on the touch screen for proper touch screen operation of the secured electronic device;
    an opening in the pouch; and
    a fastener located proximate said opening in the pouch that creates a radiofrequency tight seal when the pouch is closed.

2. The electromagnetically shielded enclosure with operable interfaces as recited in claim 1, further comprising an input/output assembly located on a side of the pouch and having electrical connections there through.

3. The electromagnetically shielded enclosure with operable interfaces as recited in claim 2, further comprising a radiofrequency filter assembly electrically coupled to at least one electrical connection on the input/output assembly.

4. The electromagnetically shielded enclosure with operable interfaces as recited in claim 1, further comprising an identification holder attached to the electromagnetically shielded enclosure with operable interfaces.

5. The electromagnetically shielded enclosure with operable interfaces as recited in claim 1, wherein the shielding material is a conductive fabric.

6. The electromagnetically shielded enclosure with operable interfaces as recited in claim 1, further comprising a window perimeter seal that electromagnetically joins the pouch and the radiofrequency shielded tactile window.

7. The electromagnetically shielded enclosure with operable interfaces as recited in claim 1, further comprising a foldover flap for ensuring a radiofrequency tight seal when the pouch is closed.

8. An electromagnetically shielded enclosure with operable interfaces, the enclosure comprising:
    a pouch comprising shielding material;
    a radiofrequency shielded tactile window that provides a tactile feel through the radiofrequency shielded tactile window to a secured electronic device placed beneath the radiofrequency shielded tactile window, the radiofrequency shielded tactile window located on a side of the pouch;
    an internal frame having an operating aperture that accommodates the secured electronic device where in use the operating aperture is covered by the radiofrequency shielded tactile window to create a trampoline style structure that maintains space from the tactile window to a touch screen of the secured electronic device to isolate contact points on the touch screen for proper touch screen operation of the secured electronic device;
    an opening in the pouch;
    a side opening in the pouch; and
    a fastener located proximate said opening in the pouch that creates a radiofrequency tight seal when the pouch is closed.

9. The electromagnetically shielded enclosure with operable interfaces as recited in claim 8, further comprising an input/output assembly located on a side of the pouch and having electrical connections there through.

10. The electromagnetically shielded enclosure with operable interfaces as recited in claim 9, further comprising a radiofrequency filter assembly electrically coupled to at least one electrical connection on the input/output assembly.

11. The electromagnetically shielded enclosure with operable interfaces as recited in claim 8, further comprising an identification holder attached to the electromagnetically shielded enclosure with operable interfaces.

12. The electromagnetically shielded enclosure with operable interfaces as recited in claim 8, wherein the shielding material is a conductive fabric.

13. The electromagnetically shielded enclosure with operable interfaces as recited in claim 8, further comprising a window perimeter seal that electromagnetically joins the pouch and the radiofrequency shielded tactile window.

14. The electromagnetically shielded enclosure with operable interfaces as recited in claim 8, further comprising a foldover flap for ensuring a radiofrequency tight seal when the pouch is closed.

* * * * *